United States Patent
Sanuki

(10) Patent No.: US 7,019,380 B2
(45) Date of Patent: Mar. 28, 2006

(54) SEMICONDUCTOR DEVICE

(75) Inventor: Tomoya Sanuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/804,206

(22) Filed: Mar. 19, 2004

(65) Prior Publication Data

US 2004/0256674 A1    Dec. 23, 2004

(30) Foreign Application Priority Data

Jun. 20, 2003  (JP) .............................. 2003-176527
Aug. 18, 2003  (JP) .............................. 2003-207695

(51) Int. Cl.
*H01L 29/00*    (2006.01)
*H01L 27/01*    (2006.01)

(52) U.S. Cl. ..................... 257/513; 257/347; 257/510

(58) Field of Classification Search ............... 257/510, 257/513, 347

See application file for complete search history.

(56) References Cited

U.S. PATENT DOCUMENTS

| | | | |
|---|---|---|---|
| H1435 H * | 5/1995 | Cherne et al. ............... | 257/347 |
| 5,663,588 A * | 9/1997 | Suzuki et al. ............... | 257/350 |
| 5,969,393 A | 10/1999 | Noguchi | |
| 6,312,980 B1 | 11/2001 | Rostoker et al. | |
| 6,396,113 B1 | 5/2002 | Fujinaga et al. | |
| 6,514,885 B1 | 2/2003 | Onga et al. | |
| 6,794,717 B1 * | 9/2004 | Matsumoto et al. ......... | 257/347 |

FOREIGN PATENT DOCUMENTS

| | | |
|---|---|---|
| JP | 07-235669 | 9/1995 |
| JP | 09-321134 | 12/1997 |
| JP | 2000-031491 | 1/2000 |
| JP | 2001-085512 | 3/2001 |
| JP | 2001-160589 | 6/2001 |
| JP | 2001-223266 | 8/2001 |
| JP | 2002-124564 | 4/2002 |
| JP | 2003-115592 | 4/2003 |
| JP | 2004-281631 | 10/2004 |
| JP | 2004-335741 | 11/2004 |
| JP | 2005-005321 | 1/2005 |

OTHER PUBLICATIONS

G. Scott et al., "NMOS Drive Current Reduction Caused by Transistor Layout and Trench Isolation Induced Stress", IEDM Tech. Dig., 1999, pp. 827-830.
K. Rim et al., "Strained Si NMOSFETs for High Performance CMOS Technology", 2001 Symposium on VLSI Technology Digest of Technical Papers, p. 59 (2 pages).
K. Rim et al., "Characteristics and Device Design of Sub-100 nm Strained Si N- and PMOSFETs", 2002 Symposium on VLSI Technology Digest of Technical Papers, p. 98 (2 pages).

* cited by examiner

*Primary Examiner*—Hung Vu
(74) *Attorney, Agent, or Firm*—Foley & Lardner LLP

(57) ABSTRACT

A semiconductor device includes a semiconductor substrate having an element region, and an element isolation region formed around the element region, the element isolation region being formed of an insulation material having a higher thermal expansion coefficient than the element region.

6 Claims, 5 Drawing Sheets

SEMICONDUCTOR DEVICE

CROSS-REFERENCE TO RELATED APPLICATIONS

This application is based upon and claims the benefit of priority from prior Japanese Patent Applications No. 2003-176527, filed Jun. 20, 2003; and No. 2003-207695, filed Aug. 18, 2003, the entire contents of both of which are incorporated herein by reference.

BACKGROUND OF THE INVENTION

1. Field of the Invention

The present invention relates to a MOS (Metal Oxide Semiconductor) type semiconductor device, and more particularly to the structure of an element-isolation region provided in the MOS.

2. Description of the Related Art

Microfabrication of semiconductor devices has recently advanced. To realize microfabrication of semiconductor devices and enhance the performance, such as current drivability, of the devices, scaling down is performed in accordance with a predetermined scaling rule. To scale down semiconductor devices, it is also necessary to scale down element isolation regions provided for electrically isolating element regions formed in its semiconductor substrate.

However, there are indications that the performance of a semiconductor device will vary if the diffusion layers forming the source and drain regions of a MOS transistor formed in and on an element region are reduced. This is because the insulating layer filled in the element isolation region produces stress in the element region. More specifically, in, for example, so-called shallow trench isolation (STI) in which a trench is formed in a substrate and filled with an insulating layer, thereby providing an element isolation region, the insulating layer produces stress in the element regions. As a result, the mobility of electrons or holes in a MOS transistor formed in and on each element region varies, which causes the performance of the semiconductor device to vary (see document 1 (G. Scott et al., IEDM Tech. Dig. 1999, pp. 827–830); document 2 (K. Rim et al., VLSI Symp., 2001, p. 59); and document 3 (K. Rim et al., VLSI Symp., 2002, p. 98)).

In existing CMOS devices, Si, for example, is used as the material of element regions, while an $SiO_2$-based material, such as TEOS, is used as the material of element isolation regions. Since the coefficient of thermal expansion of $SiO_2$ is lower than that of Si, an element isolation region produces stress in an element region, compressing the element region. In other words, when each material is cooled from a high temperature to room temperature after a thermal process, Si contracts more than $SiO_2$. At this time, compressive stress is produced in the element region by the element isolation region that contracts less than the element region. As a result, in an NMOS transistor provided at the element region, the mobility of electrons is reduced due to the compressive stress. This means that the NMOS transistor is degraded in performance, compared to transistors in which the source/drain regions have a large area.

BRIEF SUMMARY OF THE INVENTION

According to a first aspect of the present invention, there is provided a semiconductor device including: a semiconductor substrate having an element region; and an element isolation region formed around the element region, the element isolation region being formed of an insulation material having a higher thermal expansion coefficient than the element region.

According to a second aspect of the present invention, there is provided a semiconductor device including: a semiconductor substrate having an element region; and an element isolation region formed around the element region, the element isolation region having a first layer and a second layer, the first layer being formed of an insulation material and located in contact with the element region, the second layer being located inside the first layer and formed of a conductive material, the conductive material having a thermal expansion coefficient higher than a thermal expansion coefficient of the element region.

According to a third aspect of the present invention, there is provided a semiconductor device including: a semiconductor substrate; a first element region formed in the semiconductor substrate, a gate electrode being provided on the first element region, source and drain regions being formed in the first element region; an element isolation region provided around the first element region; and recesses formed in opposing sides of the first element region, the element isolation region being formed in the recesses.

DETAILED DESCRIPTION OF THE INVENTION

Embodiments of the invention will be described in detail with reference to the accompanying drawings.

(First Embodiment)

Figure 1:
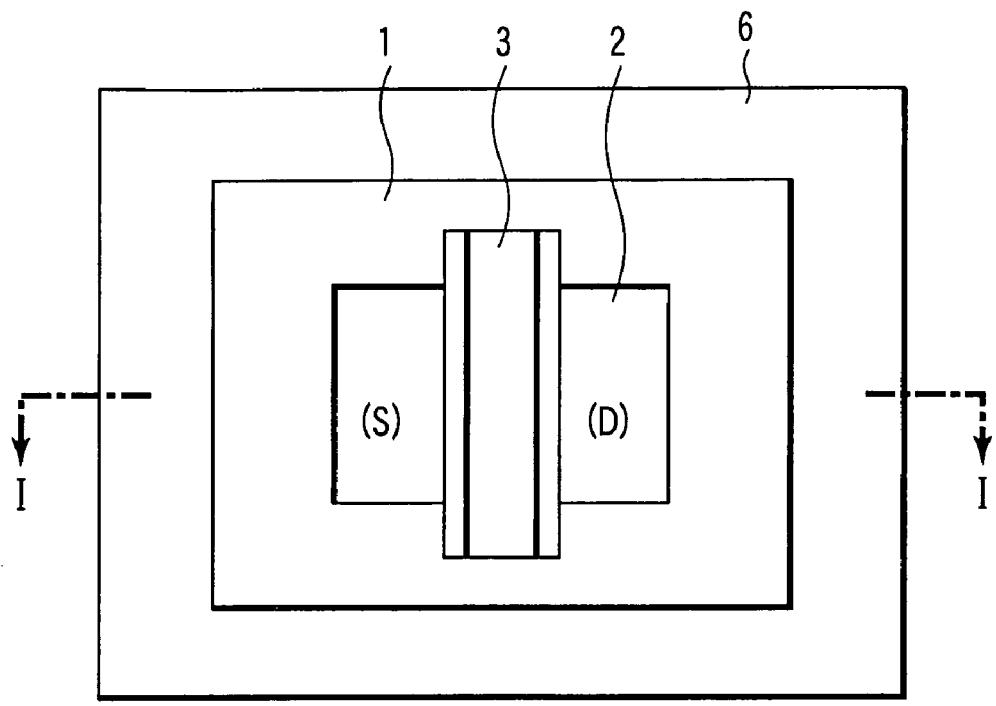
FIG. 1 is a plan view illustrating the essential part of a MOS transistor formed in a semiconductor substrate in a first embodiment of the invention.
Figure 2:
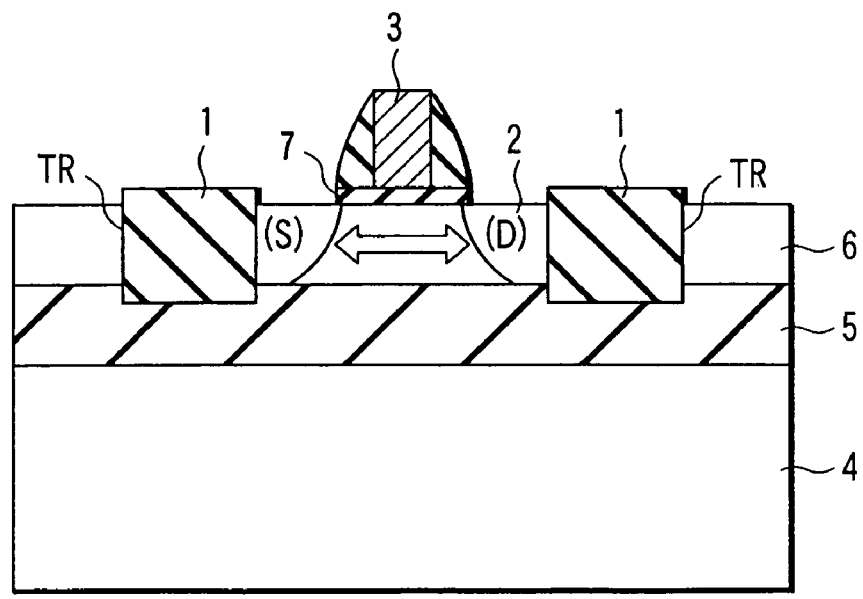
FIG. 2 is a sectional view taken along line I—I in FIG. 1.

FIG. 1 is a plan view illustrating an essential part of a MOS transistor formed in a semiconductor substrate and according to a first embodiment. This semiconductor substrate is, for example, an SOI (Silicon On Insulator) substrate. FIG. 2 is a sectional view taken along line I—I in FIG. 1.

The SOI substrate is formed of an Si substrate 4, an insulating layer 5 made of, for example, SiO2, and an Si layer 6 stacked on each other. The SOI substrate is formed by, for example, SIMOX (Separation by Implanted Oxygen).

A trench TR is formed in the Si layer 6 such that it reaches the insulating layer 5, and SiN, an insulation material, is filled in the trench TR, thereby forming an element isolation region 1. SiN is buried by, for example, plasma CVD (Chemical Vapor Deposition) method. As a result, an element region 2 is defined inside the element isolation region 1. A MOS transistor is formed in the element region 2.

Specifically, a gate electrode 3 formed of, for example, polysilicon is provided on the element region 2, with a gate insulating film 7 interposed therebetween. The gate electrode 3 has side walls. Source and drain regions S/D are formed at the opposite sides of the gate electrode 3 by, for example, implanting impurity ions. Respective electrodes (not shown), which serve as contacts, are formed in the source and drain regions and are connected to wiring (not shown). Further, another element region 6, for example, is formed outside the element isolation region 1. Although FIG. 2 shows a complete depletion type transistor, the transistor formed in the element region is not limited to this, but may be of a partial depletion type.

The material of the element isolation region 1, SiN, has a higher thermal expansion coefficient than the material of the element region 2, Si. Accordingly, when the temperature of the semiconductor substrate is reduced to a room temperature after SiN is buried into a trench by a thermal treatment, the element isolation region 1 more contracts than the element region 2. As a result, a tensile stress due to the contraction of the element isolation region 1 occurs in the element region 2.

As described above, in the first embodiment, an element isolation region formed of SiN that has a higher thermal expansion coefficient than Si is defined in the Si layer of the SOI substrate. This causes a tensile stress due to the contraction of the element isolation region 1 to occur in the element region 2. When the element region 2 expands because of the tensile stress, the mobility of carriers in the MOS transistor formed in the element region 2 increases.

(Second Embodiment)

In a second embodiment, the element isolation region comprises a first layer in contact with the element region, and a second layer inside the first layer. The first layer is formed of an insulation material, while the second layer is formed of a material having a high thermal expansion coefficient, such as a metal.

Figure 3:
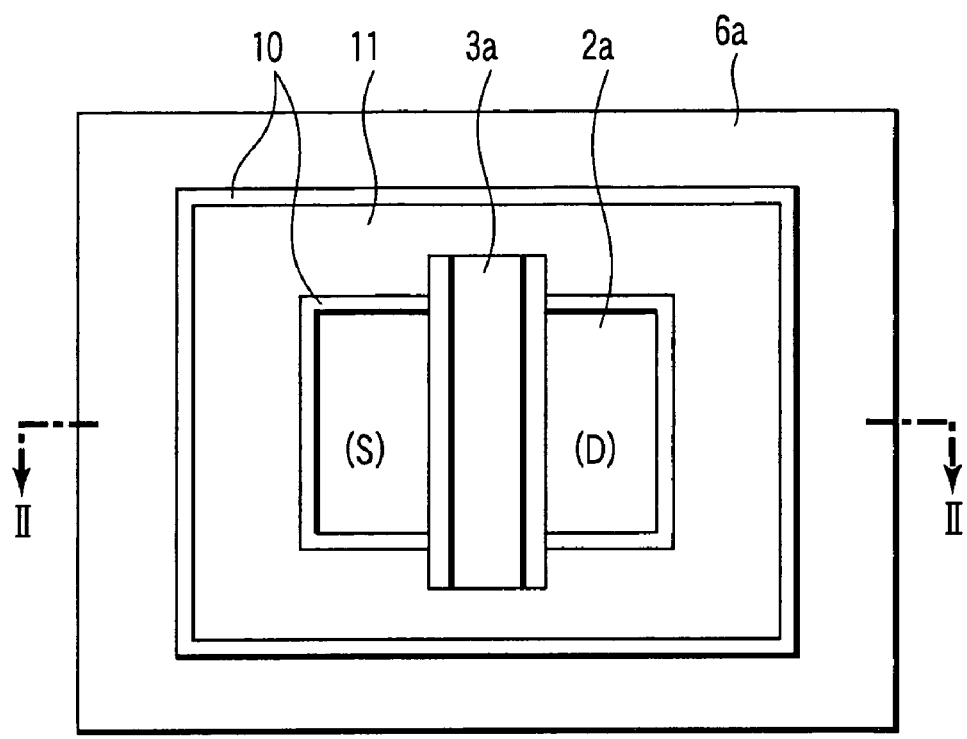
FIG. 3 is a plan view illustrating the essential part of a MOS transistor formed in a semiconductor substrate in a second embodiment of the invention.
Figure 4:
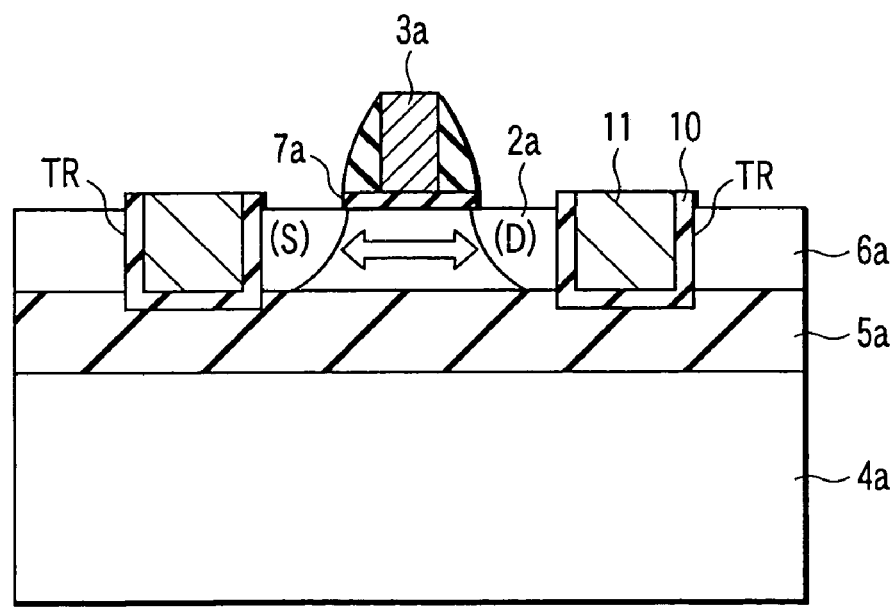
FIG. 4 is a sectional view taken along line II—II in FIG. 3.

FIG. 3 is a plan view illustrating an essential part of a MOS transistor formed in a semiconductor substrate and according to the second embodiment. This semiconductor substrate is, for example, an SOI substrate. FIG. 4 is a sectional view taken along line II—II in FIG. 1. The SOI substrate and the MOS transistor formed in the element region have the same structures as those employed in the first embodiment, therefore no descriptions are given thereof.

A trench TR is formed in an Si layer 6a on the SOI substrate such that it reaches an insulating layer 5, thereby forming an element isolation region. This element isolation region comprises a first layer 10 in contact with an element region 2a, and a second layer 11 inside the first layer 10. The first layer 10 in contact with the element region 2a is formed of, for example, SiN, an insulation material. The SiN layer 10 is formed by, for example, plasma CVD method or LP-CVD (Low pressure-Chemical Vapor Deposition) method.

The second layer 11 provided inside the SiN layer 10 is formed of a metal, such as Al, Cu, TiN, Ti, W, TaN, Co, Ni, etc.

The SiN layer 10 and metal layer 11 that provide the element isolation region has a higher thermal expansion coefficient than the material of the element region 2a, Si. Accordingly, when the temperature of the semiconductor substrate is reduced to a room temperature after the SiN layer 10 and metal layer 11 are buried into a trench by a thermal treatment, the SiN layer 10 and metal layer 11 more contract than the element region 2a. As a result, a tensile stress due to the contraction of the element isolation region occurs in the element region 2a.

As described above, in the second embodiment, a tensile stress due to the contraction of the SiN layer 10 included in the element isolation region occurs in the element region 2a. When the element region 2 expands because of the tensile stress, the mobility of carriers in the MOS transistor formed in the element region 2a increases.

Moreover, in the second embodiment, the metal layer 11 having a higher thermal expansion coefficient than the material of the element region is included in the element isolation region, thereby causing a tensile stress due to the contraction of the metal layer 11 to occur in the element region 2a. When the element region 2a further expands because of the tensile stress due to the metal layer 11, the mobility of carriers in the MOS transistor formed in the element region 2a further increases.

In the second embodiment, the second layer 11 inside the first (SiN) layer 10 is formed of a metal. However, the second layer is not limited to this, but may be formed of salicido-based TiSi, TiSi2, CoSi, CoSi2, NiSi, NiSi2, etc. It is sufficient if the material has a higher thermal expansion coefficient than Si, the material of the element region 2a.

Further, in the second embodiment, SiN is used as the material of the first layer located in contact with the element region 2a. However, SiO2, such as TEOS (Tetra-Ethyl Orso Silicate), may be used as the insulation material.

Also, in the first and second embodiments, the conductivity type of the transistor formed in the element region may be either the P channel or N channel. Both a P-channel MOS transistor and N-channel MOS transistor can be enhanced in their current drivability.

In addition, the first and second embodiments employ an SOI substrate. However, bulk Si may be used as the material of the semiconductor substrate, instead. In this case, the amount of tensile stress can be varied by changing the depth of the trench.

(Third Embodiment)

Figure 5:
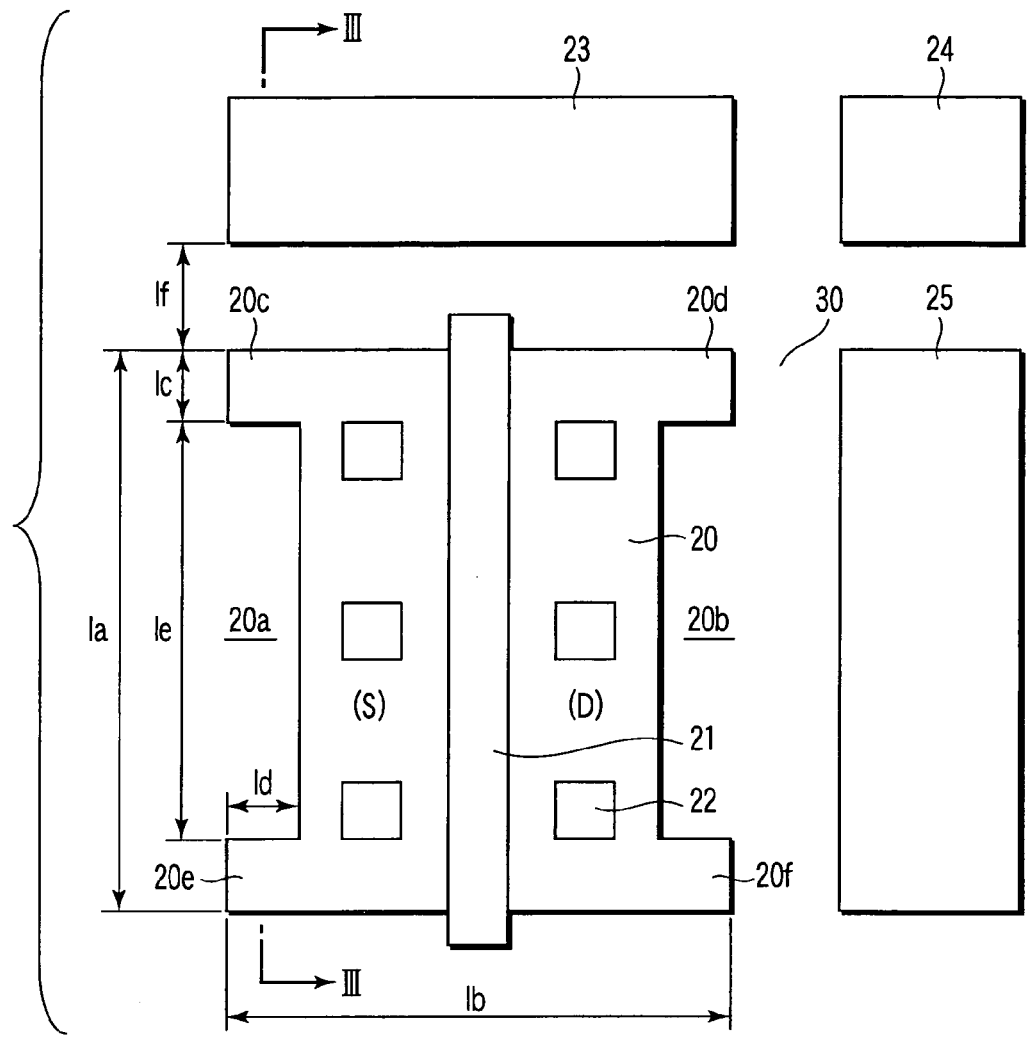
FIG. 5 is a plan view of a third embodiment of the invention, illustrating element regions formed in a semiconductor substrate and the essential part of a MOS transistor formed in the substrate.

FIG. 5 is a plan view, illustrating the essential part of a MOS transistor formed in a semiconductor substrate in a third embodiment of the invention.

A semiconductor substrate formed of, for example, Si is provided with element regions 20, 23, 24 and 25. A trench (not shown) is formed between the element regions, and filled with an insulator, such as TEOS (an $SiO_2$-based material), thereby forming an element isolation region 30. Further, an NMOS transistor is formed in the element region 20.

Specifically, a gate electrode 21 formed of, for example, polysilicon is provided on the element region 20 with a gate insulating film (not shown) interposed therebetween. Source/drain regions S/D are formed on opposite sides of the gate electrode 21. These source/drain regions S/D are formed by implanting, for example, N-type impurity ions into the element regions. Further, electrode pads 22, which will serve as a contact, are formed in the source/drain regions S/D. Wires (not shown) are connected to the electrode pads 22. This embodiment employs a transistor used as, for example, standard cell, but is not limited to standard cell.

The element region 20 has recesses 20a and 20b so that the two sides of the region 20 opposing each other in the direction of the channel length are located close to the gate electrode 21. The recesses 20a and 20b have the same shape, for example. If the channel-width directional length 1a and the channel-length directional length 1b of the element region 20 are, for example, 1 μm and 0.5 μm, respectively, the recesses 20a and 20b have the following dimensions: The channel-width directional length 1c of four projections 20c, 20d, 20e and 20f is 0.1 μm; the channel-width directional length 1e of the recesses 20a and 20b is 0.8 μm; the channel-length directional length 1d of the recesses 20a and 20b is 0.1 μm; the distance 1f between the element region 20 and the element region 23 adjacent thereto in the channel width direction is 0.1 μm, and the width of the gate electrode 21 is 0.05 μm. These dimensions are just examples and can be varied.

Figure 6:
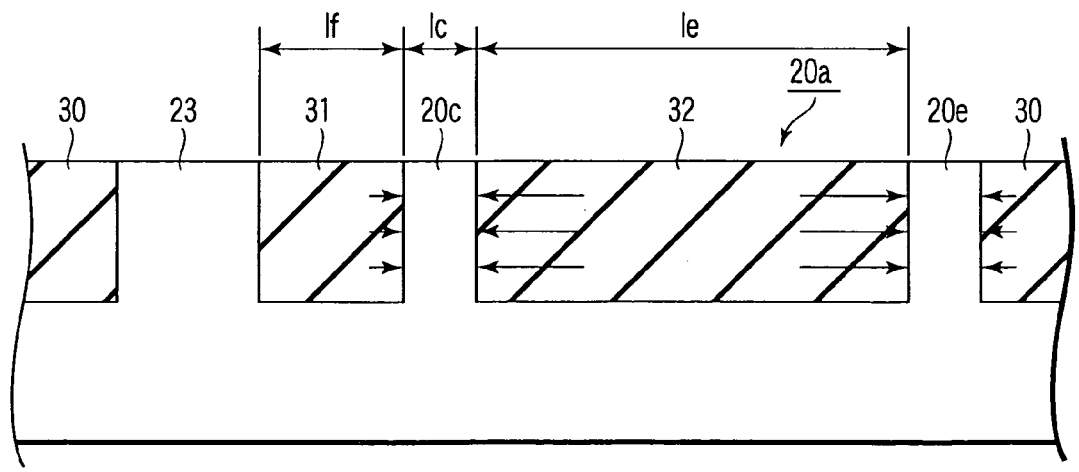
FIG. 6 is a sectional view taken along line III—III in FIG. 5.

FIG. 6 is a sectional view taken along line III—III in FIG. 5. In FIG. 6, the arrows in the substrate indicate the directions and levels of the forces applied to the element region 20 (accordingly, stresses corresponding to these forces are produced in the element region 20).

In FIG. 6, reference numeral 31 denotes an element isolation region formed between the element regions 20 and 23. Further, reference numeral 32 denotes an element isolation region formed in the recess 20a of the element region 20.

The material, $SiO_2$, of the element isolation region 30 (which includes the element isolation regions 31 and 32) has a coefficient of thermal expansion lower than Si. Therefore, when the temperature of the semiconductor substrate reduces to room temperature after $SiO_2$ is filled into the trench by a heat treatment, the element region 20 contracts more than the element isolation region 30. At this time, compressive stress is produced in the element region 20 by the element isolation region 30 that contracts less than the element region.

The length 1e of the recess 20a of the element region 20 is longer than the distance 1f between the element regions 20 and 23. Therefore, the stress produced in the projection 20c of the element region 20 by the element isolation region 32 in the recess 20a that contracts less than the element region is greater than that produced in the projection 20c of the element region 20 by the element isolation region 31 between the element regions adjacent in the channel width direction. As a result, the element region 20 expands in the channel width direction. If an element region exists adjacent to the projection 20e in the channel width direction, stress occurs in the projection 20e to expand the element region 20 in the channel width direction. Thus, the element region 20 expands in the channel width direction. The same can be said of the projections 20d and 20f. The resultant expansions absorb the compressive stress produced in the element region by the element isolation region that contracts less than the element region.

As described above in detail, in the third embodiment, the recesses 20a and 20b are employed, and parts of the element isolation region 30 are located in the recesses. Further, the element isolation region 30 is formed of a material having a lower coefficient of thermal expansion than the material of the element region 20. In addition, the length 1e of the recesses 20a and 20b is set greater than the distance 1f between the element regions 20 and 23.

By virtue of this structure, the entire element region 20 is extended in the channel width direction by the stress produced in portions of the element isolation region 30, with the result that the mobility of electrons is increased and the performance of the NMOS transistor is enhanced.

Furthermore, the level of the stress produced in the element region can be varied in a desired manner by changing the channel-length directional length of the recesses 20a and 20b.

(Fourth Embodiment)

In a fourth embodiment, recesses are formed in the two sides of an element opposing in the direction of the channel width, and the element region is extended in the direction of the channel length.

Figure 7:
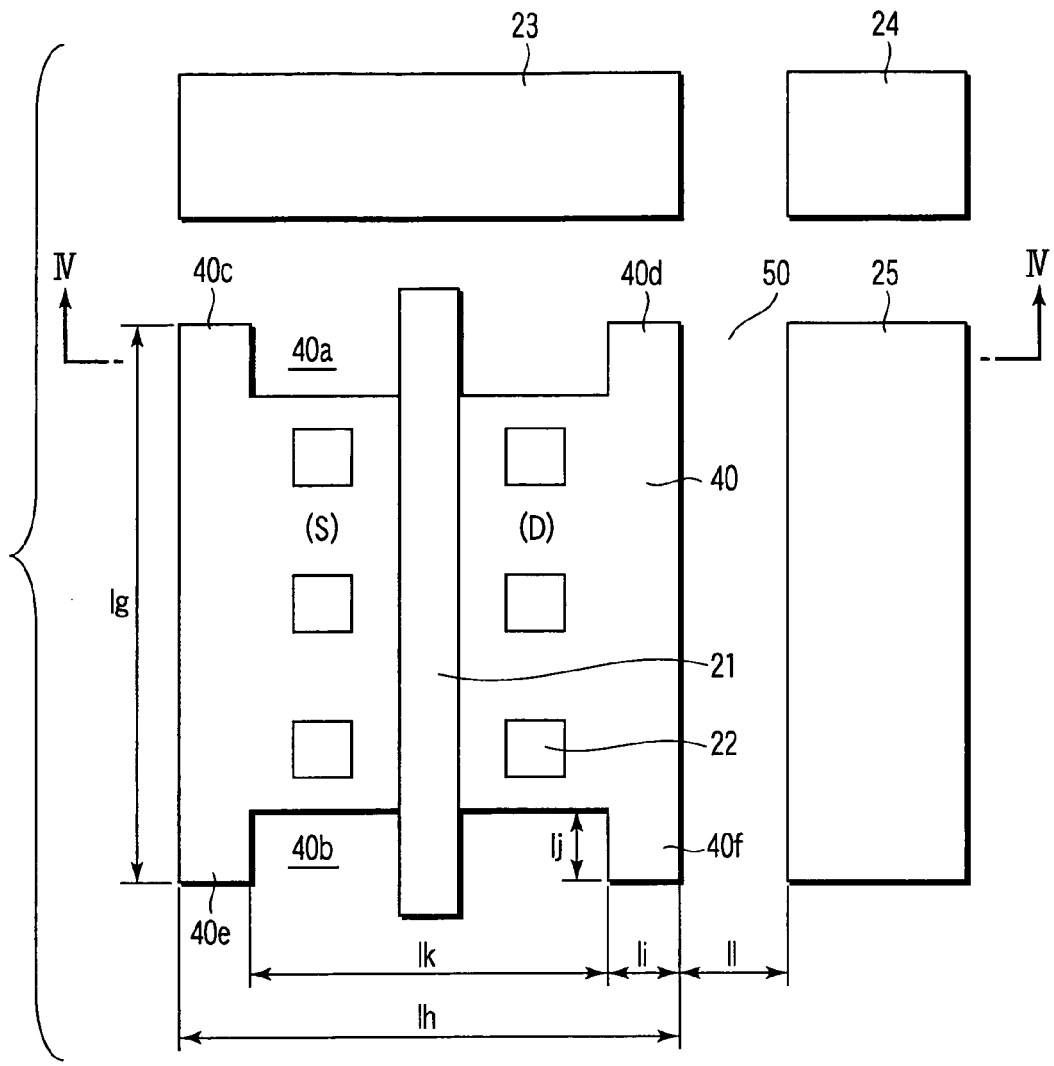
FIG. 7 is a plan view of a fourth embodiment of the invention, illustrating element regions formed in a semiconductor substrate and the essential part of a MOS transistor formed in the substrate.

FIG. 7 is a plan view of the fourth embodiment of the invention, illustrating an essential part of a MOS transistor formed in a semiconductor substrate.

Element regions 40, 23, 24 and 25 are provided on the semiconductor substrate. A trench (not shown) is formed between the element regions, and filled with an insulator, such as TEOS (an $SiO_2$-based material), thereby forming an element isolation region 50. Further, an NMOS transistor is formed in the element region 40. Since the structure of the NMOS transistor is similar to that of the NMOS transistor employed in the third embodiment, no detailed description is given thereof.

The two sides of the element region 40 opposing in the channel width direction have respective recesses 40a and 40b. The recesses 40a and 40b have the same shape, for example. If the channel-width directional length 1g and the channel-length directional length 1h of the element region 40 are, for example, 1 μm and 0.5 μm, respectively, the recesses 40a and 40b have the following dimensions: The channel-length directional length 1i of four projections 40c, 40d, 40e and 40f is 0.1 μm; the channel-length directional length 1k of the recesses 40a and 40b is 0.3 μm; the channel-width directional length 1j of the recesses 40a and 40b is 0.1 μm; the distance 1l between the element region 40 and the element region 25 adjacent thereto in the channel length direction is 0.1 μm, and the width of the gate electrode 21 is 0.05 μm. These dimensions are just examples and can be varied.

Figure 8:
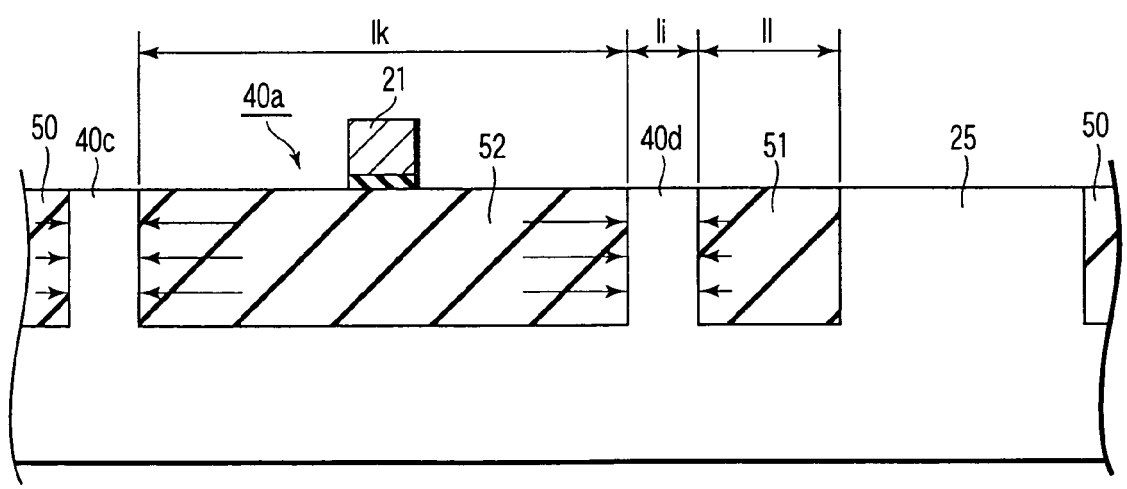
FIG. 8 is a sectional view taken along line IV—IV in FIG. 7.

FIG. 8 is a sectional view taken along line IV—IV in FIG. 7. In FIG. 8, the arrows in the substrate indicate the directions and levels of the forces applied to the element region 40 (accordingly, stresses corresponding to these forces are produced in the element region 40).

In FIG. 8, reference numeral 51 denotes an element isolation region formed between the element regions 40 and 23. Further, reference numeral 52 denotes an element isolation region formed in the recess 40a of the element region 40.

The material, $SiO_2$, of the element isolation region 50 (which includes the element isolation regions 51 and 52) has a coefficient of thermal expansion lower than Si. Therefore, when the temperature of the semiconductor substrate reduces to room temperature after $SiO_2$ is filled into the trench by a heat treatment, the element region 40 contracts more than the element isolation region 50. Accordingly, compressive stress is produced in the element region 40 by the element isolation regions 51 and 52.

The length 1k of the recess 40a of the element region 40 is longer than the distance 1l between the element regions 40 and 25. Therefore, the stress produced in the projection 40d of the element region 40 by the element isolation region 52 in the recess 40a is greater than that produced in the projection 40d of the element region 40 by the element isolation region 51 between the element regions adjacent in the channel length direction. As a result, the element region 40 expands in the channel length direction. If an element region exists adjacent to the projection 40c in the channel length direction, stress occurs in the projection 40c to expand the element region 40 in the channel length direction. Thus, the element region 40 expands in the channel length direction. The same can be said of the projections 40f and 40e. The resultant expansions absorb the compressive stress produced in the element region because of the element isolation region.

As described above in detail, in the fourth embodiment, the recesses 40a and 40b are employed, and parts of the element isolation region 50 are located in the recesses. Further, the element isolation region 50 is formed of a material having a lower coefficient of thermal expansion than the material of the element region 40. In addition, the length 1k of the recesses 40a and 40b is set greater than the distance 1f between the element regions 40 and 25.

By virtue of this structure, the entire element region 40 is extended in the channel length direction by the stress occurring in portions of the element isolation region 50, with the result that the mobility of electrons is increased and the performance of the NMOS transistor is enhanced.

Furthermore, the level of the stress produced in the element region can be varied in a desired manner by changing the length of the recesses 40a and 40b.

(Fifth Embodiment)

In a fifth embodiment, a strained-Si layer is provided on a semiconductor substrate, and an element region 60 and element isolation region 70 are provided on the strained-Si layer. The regions 60 and 70 have the same shapes as the element region 20 and element isolation region 30, respectively, employed in the third embodiment. Furthermore, a PMOS transistor is formed in and on the element region 60. Since the element region 60 and the PMOS transistor provided in and on the element region 60 are similar to those shown in FIG. 5, no figures and descriptions are given thereof.

Figure 9:
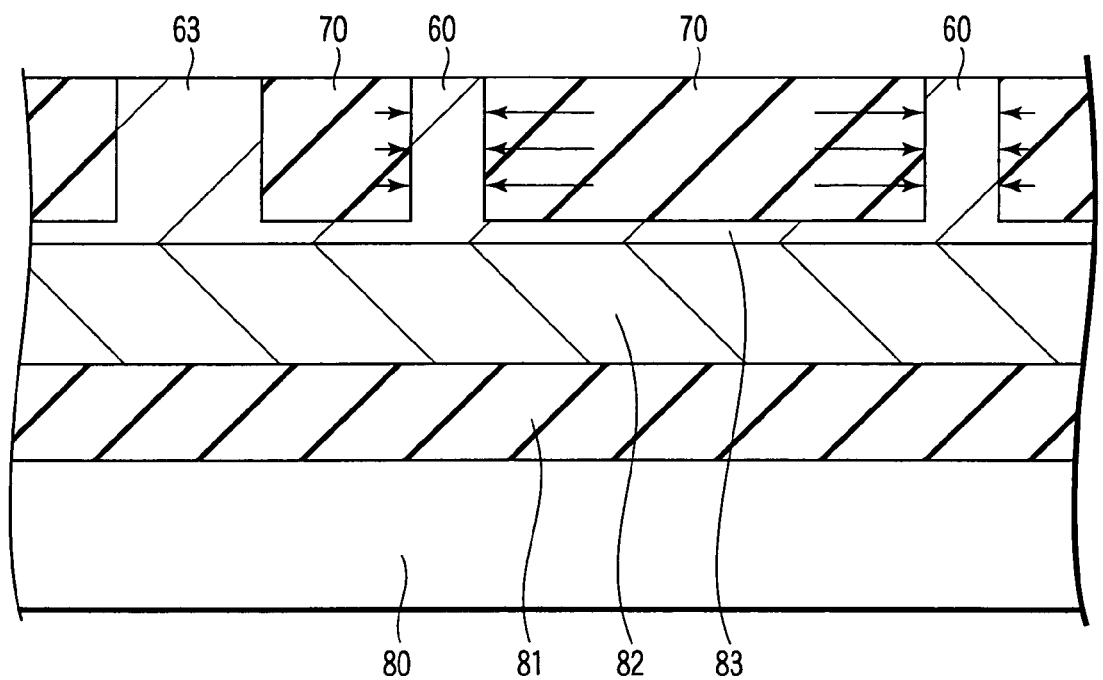
FIG. 9 is a sectional view illustrating the portion of a semiconductor substrate in a fifth embodiment that is the same as the portion taken along line III—III in FIG. 5.

FIG. 9 is a view similar to FIG. 6, illustrating the fifth embodiment. In FIG. 9, the arrows in the substrate indicate the directions and levels of the forces applied to the element region 60 (accordingly, stresses corresponding to these forces are produced in the element region 60).

In FIG. 9, reference numeral 63 denotes an element isolation region formed adjacent to the element region 60 in the channel width direction. The semiconductor substrate employed in the fifth embodiment is formed of a first Si layer 80 forming a support substrate, an $SiO_2$ layer 81 forming an insulating layer, an SiGe layer 82, and a second Si layer 83 as an active layer for forming an element, which are arranged in this order. In thus-formed semiconductor substrate, the second Si layer 83 constitutes a strained-Si layer.

This strained-Si layer 83 is formed by applying a tensile strain to Si, and has its Si band structure varied. More specifically, the strained-Si layer 83 is formed by, for example, growing an Si crystal on an SiGe layer having a lattice constant higher than Si.

In general, if the degree of expansion (e.g. a tensile strain produced in the strained-Si layer 83 by the SiGe layer 82) of a layer, in which the PMOS transistor is formed, exceeds a predetermined value, the mobility of holes as carriers is increased. Accordingly, in the PMOS transistor formed on the strained-Si layer 83 expanded by a tensile strain, the mobility of holes as carriers is increased.

The element region 60 providing the PMOS transistor has recesses formed in the two sides opposing in the direction of the channel length, like the element region 20 of FIG. 5. Accordingly, the element region 60 expands in the direction of the channel width as in the third embodiment. This absorbs compressive stress produced in the element region 60 by the element isolation region 70.

As described above in detail, in the fifth embodiment, the element region 60 and the PMOS transistor is provided on a strained-Si layer. Further, recesses are formed in the two sides of the region 60 opposing in the direction of the channel length, and the element isolation region 70 is formed of a material having a coefficient of thermal expansion lower than the material of the element region 60. Furthermore, recesses are formed in the respective sides of the element region 60 opposing in the direction of the channel length, and the element isolation region 70 is formed of a material having a thermal expansion coefficient lower than the material of the element region 60. In addition, the channel-width directional length of the recesses is much longer than the distance between the element regions 60 and 63.

In the above structure, the element region 60 is expanded in the direction of the channel width by the tensile strain of the strained-Si layer, and is further expanded by the compressive stress that is produced therein by the element isolation region. The expansion of the element region 60 increases the mobility of holes as carriers, thereby enhancing the performance of the PMOS transistor.

Further, the level of the stress produced in the element region 60 can be varied in a desired manner by changing the width of the recesses.

The performance of the PMOS transistor can be also enhanced by making the element region 60, provided in the strained-Si layer, have the same shape as the element region 40 of the fourth embodiment.

Although in the fifth embodiment, the PMOS transistor is provided on the strained-Si layer, the NMOS transistor may be provided thereon.

Similarly, in the third and fourth embodiments, the PMOS transistor may be provided in place of the NMOS transistor.

In each of the above-described embodiments, the element isolation region is formed by STI. However, it may be formed by local oxidation of silicon (LOCOS) method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first element region formed in the semiconductor substrate, a gate electrode being provided on the first element region, source and drain regions being formed in the first element region;
   first and second projections provided on only one of opposing side surfaces of the first element region and made of the same material as the first element region, the first and second region projections being provided on both ends of said one of the side surfaces;

third and fourth projections provided on only another one of the opposing side surfaces and made of the same material as the first element region, the third and fourth projections being provided on both ends of said another one of the side surfaces; and an element isolation region provided around the first element region and the projections.

2. The semiconductor device according to claim 1, wherein the opposing side surfaces of the first element region oppose each other in a direction of a channel length.

3. The semiconductor device according to claim 2, wherein a distance between the first projection and the second projection is longer than a distance between the first element region and a second element region which is separate from the first element region in a direction of a channel width, and a distance between the third projection and the fourth projection is longer than the distance between the first element region and the second element region.

4. The semiconductor device according to claim 1, wherein the element isolation region is formed of a material having a lower thermal expansion coefficient than a material of the first element region.

5. The semiconductor device according to claim 1, wherein the first element region is formed of Si, and the element isolation region is formed of $SiO_2$.

6. The semiconductor device according to claim 1, wherein the semiconductor device is an N-type semiconductor device.

* * * * *